United States Patent [19]
Wary et al.

[11] Patent Number: 5,879,808
[45] Date of Patent: Mar. 9, 1999

[54] PARYLENE POLYMER LAYERS

[75] Inventors: John Wary, Noblesville, Ind.; William F. Beach, Bridgewater, N.J.; Roger A. Olson, Avery, Wis.

[73] Assignee: Alpha Metals, Inc., Jersey City, N.J.

[21] Appl. No.: 791,609

[22] Filed: Jan. 31, 1997

Related U.S. Application Data

[63] Continuation-in-part of Ser. No. 738,319, Oct. 25, 1996, which is a continuation-in-part of Ser. No. 549,124, Oct. 27, 1995, abandoned.

[51] Int. Cl.$^6$ .......................... H01L 21/76; H01L 23/522; C08G 61/02
[52] U.S. Cl. ....................... 428/411.1; 428/447; 428/448; 428/457
[58] Field of Search .................................. 428/447, 448, 428/457, 901, 411.1

[56] References Cited

U.S. PATENT DOCUMENTS

| | | | |
|---|---|---|---|
| 3,211,128 | 10/1965 | Potter et al. | 118/49.1 |
| 3,246,627 | 4/1966 | Loeb et al. | 118/49 |
| 3,274,267 | 9/1966 | Chow | 260/649 |
| 3,297,591 | 1/1967 | Chow | 260/2 |
| 3,301,707 | 1/1967 | Loeb et al. | 117/217 |
| 3,319,141 | 5/1967 | Cariou et al. | 317/258 |
| 3,332,891 | 7/1967 | Chow et al. | 260/2 |
| 3,333,169 | 7/1968 | Valley | 317/258 |
| 3,397,085 | 8/1968 | Cariou et al. | 117/217 |
| 3,472,795 | 10/1969 | Tittmann et al. | 260/2 |
| 3,554,512 | 1/1971 | Elliott | 263/48 |
| 3,570,449 | 3/1971 | Blecherman | 118/9 |
| 3,573,968 | 4/1971 | Loeb | 111/106 |
| 3,600,216 | 8/1971 | Stewart | 117/72 |
| 3,667,424 | 6/1972 | Cornelius et al. | 118/49.5 |
| 3,670,693 | 6/1972 | Rorick et al. | 118/5 |
| 3,747,558 | 7/1973 | Harel | 118/8 |
| 3,749,601 | 7/1973 | Tittle | 117/218 |
| 3,864,202 | 2/1975 | Loeb et al. | 161/162 |
| 3,940,530 | 2/1976 | Loeb et al. | 428/206 |
| 4,110,392 | 8/1978 | Yamazaki | 264/127 |
| 4,123,308 | 10/1978 | Nowlin et al. | 156/272 |
| 4,184,188 | 1/1980 | Briglia | 361/234 |
| 4,261,762 | 4/1981 | King | 148/1.5 |
| 4,323,031 | 4/1982 | Kaplan | 118/720 |
| 4,362,125 | 12/1982 | Schadler | 118/712 |
| 4,401,052 | 8/1983 | Baron et al. | 118/718 |
| 4,468,283 | 8/1984 | Ahmed | 156/642 |
| 4,495,889 | 1/1985 | Riley | 118/666 |
| 4,508,055 | 4/1985 | Elton et al. | 118/724 |
| 4,518,623 | 5/1985 | Riley | 427/8 |
| 4,577,465 | 3/1986 | Olsen et al. | 62/55.5 |
| 4,596,208 | 6/1986 | Wolfson et al. | 118/712 |
| 4,613,306 | 9/1986 | Bauer et al. | 432/264 |
| 4,619,844 | 10/1986 | Pierce et al. | 427/248.1 |
| 4,683,143 | 7/1987 | Riley | 427/8 |
| 4,734,533 | 3/1988 | Ungarelli et al. | 570/201 |
| 4,761,269 | 8/1988 | Conger et al. | 422/245 |
| 4,781,942 | 11/1988 | Leyden et al. | 427/54.1 |
| 4,783,561 | 11/1988 | Pregaglia et al. | 570/183 |

(List continued on next page.)

FOREIGN PATENT DOCUMENTS

| | | |
|---|---|---|
| 0 102 417 A1 | 3/1984 | European Pat. Off. . |
| 0 434 227 A1 | 6/1991 | European Pat. Off. . |
| 0 679 373 A2 | 11/1995 | European Pat. Off. . |
| 650947 | 3/1951 | United Kingdom . |
| A1145005 | 3/1965 | United Kingdom . |
| WO 82/03069 | 9/1982 | WIPO . |

OTHER PUBLICATIONS

Wu et al., Chem Abstract 127:294192, 1997.

Moore et al., Vapor Depositable Polymers with Low Dielectric Constants, ACS Symp. Ser. 614 (Microelectronics Technology), pp. 449–470, 1995.

You et al., Parylene VIP™ AF–4 Preliminary Data (Jan. 1996); and Journal of Vacuum Science and Technology A11(6) 3047–52 (1993).

L. You, et al., Chemical Perspectives of Microelectronic Materials III Symposium (1992).

J. Apl. Pol. Sci., 13, 2325 Chow, et al. (1969).

Chow, S.W., "Poly (α,α,α',α'—tetrafluoro–p–xylylene)", *Journal of Applied Polymer Science*, vol. 13, pp. 2325–2332, 1969.

You, L. et al., "Vapor Deposition fo Parylene Films From Precursors", *Chemical Perspectives of Microelectronic Materials III Symposium* (1992).

Mikami Takashi, "Quartz Crystal Oscillator Type Radical Beam Monitor", *Patent Abstracts of Japan*, Patent No. 07050258 (1995).

Primary Examiner—Mukund J. Shah
Assistant Examiner—Deepak R. Rao
Attorney, Agent, or Firm—Mintz, Levin, Cohn, Ferris, Glovsky and Popeo, P.C.

[57] ABSTRACT

Multi-level structures including a first layer with a parylene polymer layer deposited thereon. The parylene polymer layer has the structure:

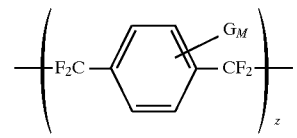

m is an integer having a value of 0, 1, 2, 3 or 4, and z is greater than 1. G is a halogen, an alkyl group, a cyclo hydrocarbon, an alkylene group or an alkylyne group having the general formula $C_nH_yX_w$. X is a halogen, and n is an integer greater than zero. The sum of y and w is at most equal to a 2n+1. The parylene polymer layer can have a zinc impurity level of about 66 parts per billion or less. The parylene polymer layers are formed by a process in which monomers are formed outside of a deposition zone of a vacuum chamber. The monomers may be prepared by a process in which a parylene dimer is vaporized and subsequently pyrolized. The process may further include the step of passing the vapor through a post-pyrolysis zone prior to depositing the monomer on the substrate.

54 Claims, 2 Drawing Sheets

U.S. PATENT DOCUMENTS

| | | | |
|---|---|---|---|
| 4,795,838 | 1/1989 | Bornengo et al. | 570/184 |
| 4,816,608 | 3/1989 | Bornengo et al. | 570/184 |
| 4,846,998 | 7/1989 | Pohl et al. | 252/299.63 |
| 4,853,488 | 8/1989 | Ungarelli et al. | 570/184 |
| 4,877,433 | 10/1989 | Oshitari | 55/486 |
| 4,883,020 | 11/1989 | Kasai et al. | 118/719 |
| 4,886,923 | 12/1989 | Ungarelli et al. | 570/210 |
| 4,902,572 | 2/1990 | Horne et al. | 428/409 |
| 4,903,754 | 2/1990 | Hirscher et al. | 165/1 |
| 4,917,940 | 4/1990 | Hopson, Jr. et al. | 428/216 |
| 4,921,723 | 5/1990 | Nichols et al. | 427/41 |
| 4,945,856 | 8/1990 | Stewart | 427/255.3 |
| 4,957,602 | 9/1990 | Binder et al. | 204/192.31 |
| 4,957,781 | 9/1990 | Kanagae et al. | 118/725 |
| 5,002,011 | 3/1991 | Ohmine et al. | 118/725 |
| 5,007,372 | 4/1991 | Hattori et al. | 118/715 |
| 5,015,503 | 5/1991 | Varrin, Jr. et al. | 427/255.2 |
| 5,028,359 | 7/1991 | Cicuta | 264/4 |
| 5,078,091 | 1/1992 | Stewart | 118/719 |
| 5,078,851 | 1/1992 | Nishihata et al. | 204/298.34 |
| 5,079,045 | 1/1992 | Luhmann et al. | 427/444 |
| 5,088,444 | 2/1992 | Ohmine et al. | 118/719 |
| 5,091,207 | 2/1992 | Tanaka | 427/8 |
| 5,110,903 | 5/1992 | Lee et al. | 528/397 |
| 5,112,642 | 5/1992 | Wajid | 427/10 |
| 5,121,707 | 6/1992 | Kanoo | 118/725 |
| 5,123,375 | 6/1992 | Hansen | 118/715 |
| 5,129,360 | 7/1992 | Ahern et al. | 118/724 |
| 5,151,133 | 9/1992 | Ohmine et al. | 118/725 |
| 5,153,986 | 10/1992 | Brauer et al. | 29/846 |
| 5,167,717 | 12/1992 | Boitnott | 118/724 |
| 5,186,120 | 2/1993 | Ohnishi et al. | 118/667 |
| 5,210,341 | 5/1993 | Dolbier, Jr. et al. | 570/144 |
| 5,217,755 | 6/1993 | Thebault et al. | 427/248.1 |
| 5,221,403 | 6/1993 | Nozawa et al. | 156/345 |
| 5,228,501 | 7/1993 | Tepman et al. | 165/80.1 |
| 5,248,370 | 9/1993 | Tsui et al. | 156/345 |
| 5,248,380 | 9/1993 | Tanaka | 156/626 |
| 5,250,092 | 10/1993 | Nakano | 96/136 |
| 5,250,323 | 10/1993 | Miyazaki | 427/255.1 |
| 5,254,171 | 10/1993 | Hayakawa et al. | 118/723 |
| 5,261,963 | 11/1993 | Basta et al. | 118/724 |
| 5,262,194 | 11/1993 | Bischer, Jr. et al. | 427/9 |
| 5,264,039 | 11/1993 | Gobush et al. | 118/726 |
| 5,266,118 | 11/1993 | Mitra | 118/726 |
| 5,268,033 | 12/1993 | Stewart | 118/724 |
| 5,268,202 | 12/1993 | You et al. | 427/255.6 |
| 5,270,082 | 12/1993 | Lin et al. | 427/539 |
| 5,270,266 | 12/1993 | Hirano et al. | 437/228 |
| 5,274,913 | 1/1994 | Grebe et al. | 29/840 |
| 5,292,554 | 3/1994 | Sinha et al. | 427/251 |
| 5,302,767 | 4/1994 | Galley et al. | 570/184 |
| 5,324,540 | 6/1994 | Terada | 427/255.5 |
| 5,344,492 | 9/1994 | Sato et al. | 118/725 |
| 5,350,453 | 9/1994 | Schlosser | 118/719 |
| 5,401,316 | 3/1995 | Shiraishi et al. | 118/689 |
| 5,439,525 | 8/1995 | Peichl et al. | 118/726 |
| 5,440,172 | 8/1995 | Sutrina | 257/712 |
| 5,447,799 | 9/1995 | Loh et al. | 118/724 |
| 5,458,687 | 10/1995 | Shichida et al. | 118/724 |
| 5,461,545 | 10/1995 | Lerov et al. | 361/765 |
| 5,470,802 | 11/1995 | Gnade et al. | 437/238 |
| 5,534,068 | 7/1996 | Beach et al. | 118/719 |

PARYLENE POLYMER LAYERS

CROSS-REFERENCE TO RELATED PATENT APPLICATION

The present application is a continuation-in-part application under 35 U.S.C. § 120 to U.S. patent application Ser. No. 08/738,319, and entitled Parylene Polymer Layers, filed Oct. 25, 1996, which is a continuation-in-part of U.S. patent application Ser. No. 08/549,124, and entitled Multi-Level Circuit Structure Including Fluorinated Parylene Polymer Dielectric Interlayers, filed Oct. 27, 1995, now abandoned.

BACKGROUND OF THE INVENTION

1. Field of the Invention

The present invention relates generally to parylene polymer layers, and more specifically to such layers which are disposed between electrically conductive layers in integrated circuits.

2. Discussion of the Related Art

Semiconductors are widely used in integrated circuits for electronic products systems such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. However, some of these desires may be in opposition to each other. For example, simply shrinking the feature sizes on a given circuit from 0.5 microns to 0.25 microns can increase power consumption by 30%. Likewise, doubling operational speed generally doubles power consumption. Miniaturization also generally results in increased capacitive coupling, or cross talk, between conductors which carry signals across the chip. This can limit achievable speed and degrade the noise margin used to insure proper device operation.

One way to diminish power consumption and cross talk effects is to decrease the dielectric constant of electrically insulating layers that separate layers of electrically conductive materials within the integrated circuit. In addition, since operational conditions may include high temperatures, it can be advantageous to use materials with relatively high thermal stability to form the insulating layers.

Silicon dioxide is one of the most common materials used in insulating layers for integrated circuits. However, silicon dioxide is non-ideal due to its comparatively high dielectric constant of about 3.9.

Layers formed from parylene polymers have been proposed for use as insulating layers in integrated circuits because these materials have relatively low dielectric constants and comparatively high melting temperatures. Parylene polymers are poly-p-xylylenes which may be prepared starting with a dimer having the structure:

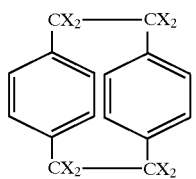

wherein X is typically a hydrogen or a halogen. The most common forms of parylene dimers include the following:

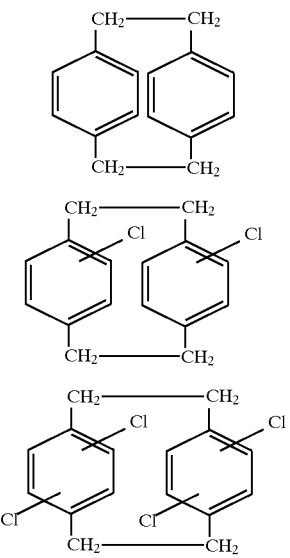

Polymer films formed from these parylene dimers may have comparatively low dielectric constants and relatively high melting temperatures. However, these parylene polymer films have relatively high dielectric constants and inferior thermal stabilities, rendering them less attractive for use in integrated circuits.

Typically, a vapor deposition method is used to form parylene polymer layers from parylene dimers. One such vapor deposition method is disclosed in *Journal of Applied Polymer Science* 13, 2325 (1969). According to this method, commonly referred to as the Gorham process, the parylene dimer is cracked at an elevated temperature to produce parylene monomer having the structure:

$$\text{CX}_2 = \bigcirc = \text{CX}_2$$

The parylene monomer is condensed onto a substrate at a temperature of from about room temperature to about $-35°$ C. Under these conditions, the parylene monomer simultaneously polymerizes on the substrate to form a layer of the parylene polymer adhered to the substrate.

A vapor deposition process for forming poly-p-xylylene films from other than parylene dimer materials is disclosed in U.S. Pat. No. 5,268,202 (You). The method disclosed by this reference includes forming the monomer vapor inside the vacuum chamber in which deposition occurs, precluding the purification opportunities afforded by the parylene dimer process prior to deposition on the substrate. Therefore, the resulting poly-p-xylylene layers have relatively high impurity levels. For example, *Journal of Vacuum Science and Technology* A11(6), 3057 (1993) discloses that poly-p-xylylene films formed by the method of You have zinc impurity levels of about 3%. Such a comparatively high level of zinc impurity results in problems with the poly-p-xylylene film relating to, for example, increased dielectric constant, decreased surface resistivity, ion movement within the layer, film surface charging effects and/or electron storm formation when the poly-p-xylylene film is used within a multi-level structure. As a result, these poly-p-xylylene films cannot be used in integrated circuits.

Hence, it remains a challenge in the art to provide an electrically insulating layer for use in integrated circuits of electronic devices that has a relatively low dielectric constant and comparatively high melting temperature. It is a further challenge in the art to provide such an insulating layer which is formed from a parylene polymer.

SUMMARY OF THE INVENTION

In one illustrative embodiment, the present invention provides a multi-level structure that includes a first layer and a parylene polymer layer disposed along the first layer. The parylene polymer layer is formed from a material having the structure:

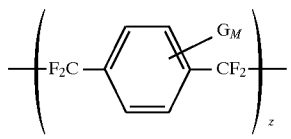

m is an integer having a value of 0, 1, 2, 3 or 4, and z is greater than 1. G is a halogen, alkyl group, cyclo hydrocarbon, alkylene group or alkylyne group having the general formula $C_nH_yX_w$, wherein X is a halogen, n is an integer greater than zero. If G is an alkyl group, y+w equals 2n+1, but if G is a cyclo hydrocarbon, alkylene group or an alkylyne group, y+w is less than 2n+1. The parylene polymer layer has a zinc impurity level of at most about 66 parts per billion.

In another illustrative embodiment, the present invention provides a method making a multi-level structure. The method includes the steps of depositing a monomer on a surface of a first layer and polymerizing the monomer to form a parylene polymer film on the surface of the first layer. The parylene polymer has the structure:

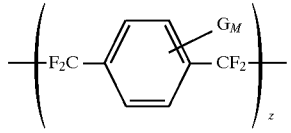

m is an integer having a value of 0, 1, 2, 3 or 4, and z is greater than 1. G is a halogen, an alkyl group, a cyclo hydrocarbon, an alkylene group or an alkylyne group having the general formula $C_nH_yX_w$, wherein X is a halogen, n is an integer greater than zero. If G is an alkyl group, y+w equals 2n+1, but if G is a cyclo hydrocarbon, alkylene group or an alkylyne group, y+w is less than 2n+1. The parylene polymer layer has a zinc impurity level of at most about 66 parts per billion.

In a further illustrative embodiment, the present invention provides a multi-level structure that comprises a first layer and a parylene polymer layer disposed along the surface of the first layer. The parylene polymer layer is formed from a material having the structure:

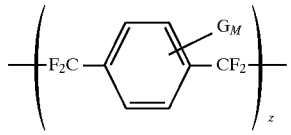

m is an integer having a value of 0, 1, 2, 3 or 4, and z is greater than 1. G is a halogen, an alkyl group, a cyclo hydrocarbon, an alkylene group or an alkylyne group having the general formula $C_nH_yX_w$, wherein X is a halogen, n is an integer greater than zero. If G is an alkyl group, y+w equals 2n+1, but if G is a cyclo hydrocarbon, alkylene group or an alkylyne group, y+w is less than 2n+1. The parylene polymer layer has a zinc impurity level of at most about 66 parts per billion. The multi-level structure is formed by a process that includes: vaporizing a parylene dimer; and pyrolizing the parylene dimer to form a monomer.

In one aspect, it is a feature of the present invention to provide parylene polymer films that can be effectively used in relatively harsh environments, such as, for example, high temperature (e.g., above about 200° C.), high corrosion or both.

BRIEF DESCRIPTION OF THE DRAWINGS

The advantages and features of the present invention will be more clearly understood in view of the following detailed description when taken in conjunction with the drawings, in which.

DETAILED DESCRIPTION

Figure 1:
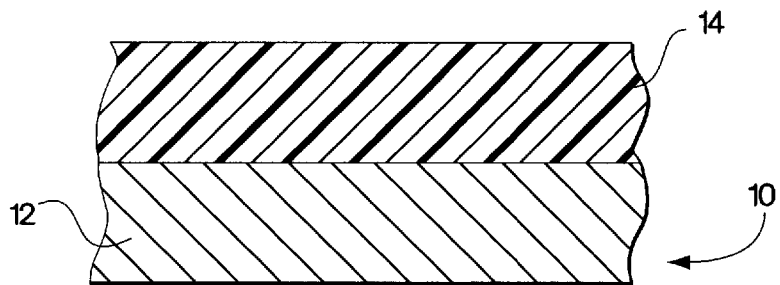
FIG. 1 is a cross-sectional view of one embodiment of a multi-level structure according to the present invention.

FIG. 1 depicts a multi-level structure 10 according to the present invention. Structure 10 includes substrate layer 12 and parylene polymer layer 14. By "parylene polymer" it is herein meant to refer to a poly-p-xylylene formed from a parylene dimer.

Substrate layer 12 may be formed from any materials onto which parylene polymer layer 14 is capable of being deposited. These materials may include electrically conductive and electrically non-conductive materials. The particular material from which layer 12 is formed depends upon the application, and such materials are known to those skilled in the art. For example, substrate layer 12 may be formed from organic materials or inorganic materials including, but not limited to, aluminum, iron, steel, molybdenum, aluminum oxide, titanium oxide, lead oxide, copper oxide, iron oxide, beryllium oxide, manganese oxide, tungsten oxide, tantalum oxide, vanadium oxide, silicones, natural rubbers, plastics, plastic composites, cellulosic materials, epoxy-containing compounds, thermosetting compounds, thermoplastic compounds, oxides of silicon (e.g., fly ash, hydrated silica, silica, quartz, aerogels, xerogels and fumed silica) and the like. Furthermore, layer 12 may comprise gallium arsenide or other binary semiconductors.

Substrate layer 12 may also be formed from a vacuum compatible liquid. By "vacuum compatible" it is herein meant to refer to a material that has a vapor pressure at the operating temperature of the vacuum chamber used such that the minimum pressure to which the vacuum chamber can be pumped is independent of the presence of the vacuum compatible material. One example of a vacuum compatible liquid is gamma-methacryloxypropyltrimethoxysilane.

In certain embodiments, substrate layer 12 may be a printed circuit board, a silicon backboard, a fiberglass backboard, a silicon wafer, paper, a key pad, a catheter, a pacemaker cover, a subcutaneous probe, a bird feather, a silicone O-ring, parts of a mechanical apparatus, such as an automobile, or the like.

Parylene polymer layer 14 is formed from a material having the structure:

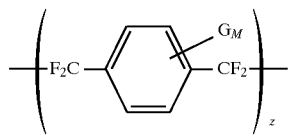

m is an integer having a value of 0, 1, 2, 3 or 4, and z is greater than 1. G is a halogen, an alkyl group, a cyclo hydrocarbon an, alkylene group or an alkylyne group having the general formula $C_nH_yX_w$, wherein X is a halogen, n is an integer greater than zero and z is 1. If G is an alkyl group (i.e., saturated) then $y+w=2n+1$. If G is a cyclo hydrocarbon, an alkylene or alkylyne group (i.e., G has at least one degree of unsaturation) then y+w is less than 2n+1 by a factor of twice the degree of unsaturation.

Figure 2:
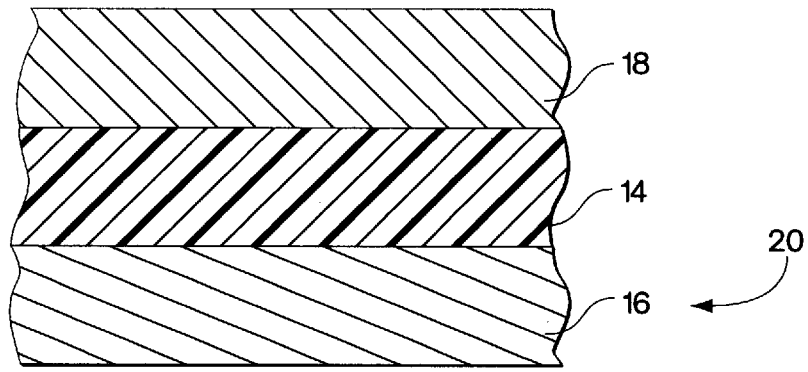
FIG. 2 is a cross-sectional view of another embodiment of a multi-level structure according to the present invention.

FIG. 2 depicts another multi-level structure 20 according to the present invention. Structure 20 includes parylene polymer layer 14 disposed between a first layer of material 16 and a second layer of material 18. Although not limited to these materials, layers 16 and 18 may be formed from any of the materials listed above with reference to substrate layer 12. Furthermore, layer 16 and/or layer 18 may take on any of the above-noted shapes of substrate layer 12. Layer 16 and/or layer 18 may take on other shapes as well.

In certain embodiments, each of layers 16 and 18 may be formed from materials that are at least partially electrically conductive. In such embodiments, layers 16 and 18 may be formed from metals using standard photolithographic and etching techniques. For these embodiments, layers 16 and 18 may each correspond to a power plane, a ground plane or a metal interconnection trace layer. Other processes for forming layers 16 and 18 are known to those skilled in the art and are intended to be within the scope of the present invention.

Parylene polymer layer 14 may be relatively difficult to adhere to certain other materials, so it may be desirable to promote the adhesion of layer 14 to other surfaces. Accordingly, parylene polymer layer 14 may undergo certain surface treatments to increase its ability to adhere to other surfaces. Such treatments include, for example, plasma treatment, corona treatment, charge treatment and/or other surface roughening treatments. These treatments are known to those skilled in the art and are intended to be within the scope of the present invention. These surface treatments may be performed on the entire surface of layer 14 or only on portions thereof. Furthermore, in some embodiments, layer 16 and/or layer 18 may be formed from a material that promotes adhesion between parylene polymer layer 14 and other layers. For such embodiments, layer 14 may or may not undergo any of the above-noted surface treatments.

For some applications, it may be advantageous to prevent the diffusion of materials through parylene polymer layer 14. For these applications, layer 16 and/or layer 18 may be formed from materials that reduce or eliminate the diffusion of materials through parylene polymer layer 14. Materials appropriate for use in these applications are disclosed in, for example, U.S. Pat. No. 5,470,802. Other such materials are known to those skilled in the art and are intended to be within the scope of the present invention.

For certain uses, such as, for example, electronic circuits, it may be desirable to form relatively flat layers, but, since parylene polymer layer 14 is comparatively conformal, layer 14 may not have the desired degree of flatness. Hence, it may be advantageous to grind or otherwise treat layer 14 to make it more flat, often referred as planarizing within the art. However, in certain embodiments, layer 14 may be difficult to planarize. For these embodiments, layer 16 and/or layer 18 may be formed from a material that is more readily planarized. Typically, such a material is a dielectric material, but, in some instances, it may be an electrical conductor.

Figure 3:
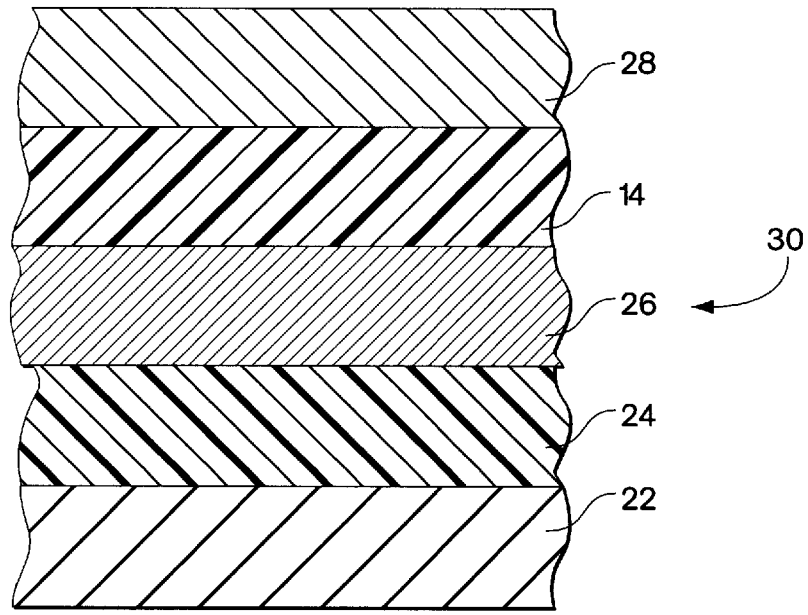
FIG. 3 is a cross-sectional view of a portion of one embodiment of an integrated circuit including a multi-level structure according to the present invention.

FIG. 3 shows a portion 30 of a multi-level electronic circuit according to the present invention. Portion 30 includes silicon wafer substrate 22, electrically insulating layer 24, electrically conductive layer 26, electrically conductive layer 28 and parylene polymer layer 14 disposed between layers 26 and 28.

Silicon wafer substrate 22 may be formed from any of the standard substrate materials used in the electronics industry, such as, for example, a silicon backboard or a fiberglass backboard. Other appropriate structures for wafer substrate 22 are known to those skilled in the art and are intended to be within the scope of the present invention.

Electrically insulating layer 24 typically functions to protect wafer substrate 22 from electrically conductive layers 26 and 28. Layer 24 is usually formed from silicon dioxide, although other appropriate materials may be used. Electrically insulating layer 24 may be formed according to any of the standard techniques known to those skilled in the art.

Electrically conductive layers 26 and 28 may be formed from metals or other materials appropriate for use in electronic circuits. Layers 26 and 28 may comprise metal conductor lines which are formed according to standard photolithographic and etching techniques. For such embodiments, layers 26 and 28 may each correspond to a power plane, a ground plane or an interconnection trace layer.

Electrically conductive layers 26 and 28 may be interconnected through parylene polymer layer 14 by use of vias, or through holes (not shown), which are formed in parylene polymer layer 14 by conventional processes known to those skilled in the art.

Figure 4:
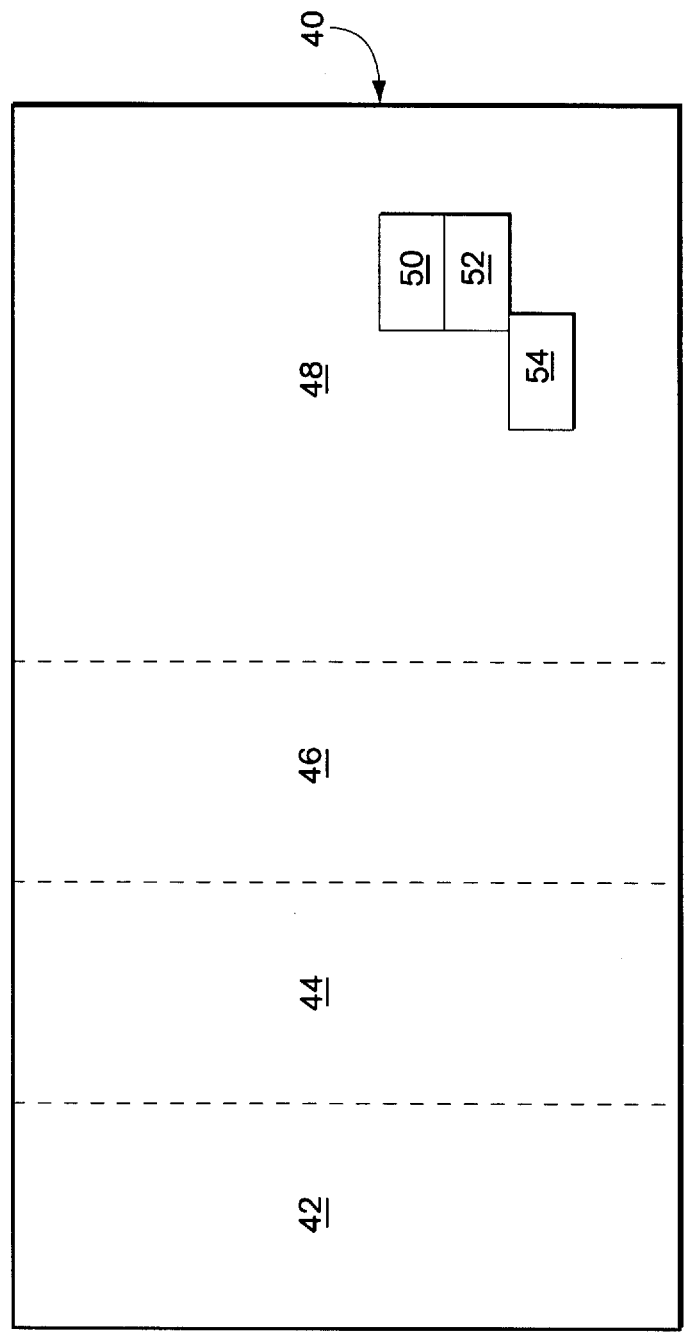
FIG. 4 is a block diagram of one embodiment of a vacuum chamber which may be used to form parylene polymer layers according to the present invention.

According to the present invention, parylene polymer layer 14 is formed using a vapor deposition process. Preferably, the vapor deposition process allows the monomer to be formed outside the deposition portion of the vacuum chamber such that the monomers can undergo a purification process prior to being deposited onto the substrate. In a particularly preferred embodiment, parylene polymer layer 14 is formed using a vacuum chamber 40 as depicted in FIG. 4. Vacuum chamber 40 includes vaporization zone 42, a pyrolysis zone 44, a post-pyrolysis zone 46 and a deposition zone 48. Examples of such vacuum chamber are disclosed in, for example, commonly assigned U.S. Pat. No. 5,546,473, which is herein incorporated by reference.

A dimer material having the structure:

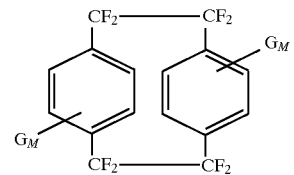

is placed within vaporization zone 42 at about room temperature and subsequently heated to a temperature of from about 70° C. to about 150° C. to vaporize the dimer.

The vaporized dimer passes into pyrolysis zone 44 which is maintained at a temperature of from about 600° C. to about 720° C. to pyrolize the dimer (i.e.. cleave certain chemical bonds) and form a monomer having the following structure:

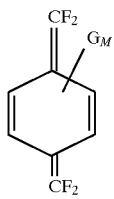

The monomer passes through post-pyrolysis zone 46 which is maintained at a temperature of at most about room temperature. At this temperature, residual vaporized dimer can adhere to the walls of post-pyrolysis zone 46 while the monomer generally passes through post-pyrolysis zone 46 without adhering to the walls of zone 46. Thus, post-pyrolysis zone 46 reduces the amount of vaporized dimer that ultimately enter deposition chamber 48. In certain embodiments, this feature can be advantageous because the vaporized dimer can constitute an impurity in parylene polymer layer 14, which may have an undesirable local effect on the dielectric constant or other properties of layer 14.

After passing through post-pyrolysis zone 46, the monomer enters deposition chamber 48 which includes substrate 50. Substrate 50 is placed on a platen 52 that includes a standard temperature controlling device 54 that controls the temperature by the platen by heating and/or cooling platen 54. By use of device 54, the temperature of substrate 50 and platen 52 is typically held at a temperature of from about room temperature to about –25° C. during deposition of the monomer onto substrate 50.

It has been found that reducing the temperature of substrate 50 and platen 52 during monomer deposition can provide several advantages, including more control of the overall process of making parylene polymer layer 14 by allowing for increased manipulation of the monomer. For example, cooling substrate 50 and platen 52 allows for the walls of deposition chamber 48 to be heated during monomer deposition. In addition, reducing the temperature of substrate 50 and platen 52 during monomer deposition results in a more efficient deposition process and a more efficient use of the parylene dimer starting material.

Subsequent to monomer deposition, device 54 may be used to increase the temperature of substrate 50 and platen 52 to a temperature of from about 100° C. to about 400° C. to anneal the parylene polymer layer. However, it is to be noted that polymerization of the parylene monomer occurs spontaneously at the temperatures of substrate 50 noted above.

Prior to placing the dimer within vaporization zone 46, the dimer is first purified. Since the dimer of the present invention has a high degree of symmetry, it is readily purified by crystallization. Typically, these solvents are relatively unsymmetric in order to have a high temperature coefficient of solubility. However, if the solvent is too symmetric, separation of the solvent from the dimer may be difficult. Without wishing to be bound by any theories, it is believed that this increased difficulty in solvent/dimer separation results from the accidental accommodation of the solvent within the dimer lattice. Solvents appropriate for use in dimer crystallization according to the present invention include, but are not limited to, chloroform, tetrahydrofuran, methylene chloride, and linear hydrocarbons such as n-hexane and n-heptane. In a preferred embodiment, the solvent is n-hexane. After dissolving the dimer in the solvent, this solution is typically passed through a chromatographic bed including a polar material such as, for example, alumina. The polar nature of the chromatographic bed removes many of the polar or ionic impurities present within the solution. Furthermore, the chromatographic bed can remove fine impurities within the solution by filtration.

Using this process has been found to produce parylene polymer layers which have reduced levels of impurities. For example, parylene polymer layers in accordance with the present invention may have zinc impurity levels of 66 parts per billion or less. This feature of the present invention is desirable because impurities within parylene polymers can result in several different negative effects, including, but not limited to, an increase in the dielectric constant of the parylene polymer layer, a decrease in the surface resistivity of the parylene polymer layer and/or electron storm formation within the multi-level structure.

While particular apparatuses and methods of making parylene polymer layer 14 have been described herein, one skilled in the art would understand that at least certain aspects of these apparatuses and methods may be varied or modified, and such variations and modifications are intended to be within the scope of the present invention. For example, in addition to cleaving the parylene dimer bond by use of elevated temperature as discussed above, the parylene dimer may be cleaved by use of a plasma. Such methods are disclosed in, for example, Russian Patent Nos. RU 2,000, 850 and RU 2,002,519.

When used in integrated circuits or for other electronics applications, parylene polymer layer 14 should have a minimal dielectric constant to enhance circuit operating speed and decrease power consumption. Accordingly, these parylene polymer layers preferably have a dielectric constant of at most about 2.6, more preferably at most about 2.4 and most preferably at most about 2.2.

Having a low dissipation factor decreases the signal loss in an integrated circuit. Therefore, parylene polymer layers in accordance with the present invention preferably have a dissipation factor of less than about 0.001.

According to the present invention, parylene polymer layers with a thickness of about one micrometer preferably have a breakdown voltage of at least about 750 volts.

Parylene polymer layer 14 preferably has a Young's modulus of about 5 gigapascals.

The elongation to break of parylene polymer layers according to the present invention is preferably at least about 20%.

Parylene polymer layer 14 preferably has an ultimate tensile strength of at least about 122 megapascals.

According to the present invention, parylene polymer layers have water absorption values of at most about 0.5% by weight, more preferably at most about 0.2% by weight and most preferably at most about 0.1% by weight.

Parylene polymer layers in accordance with the present invention preferably have a thermal stability such that these layers demonstrate less than 1% weight loss per 2 hours at a temperature of at least about 450° C.

Parylene polymer layer 14 preferably has a crystalline melting point of above about 500° C.

The surface resistivity of parylene polymer layers in accordance with the present invention is preferably about $1.3 \times 10^{14}$ ohms.

The volume resistivity of parylene polymer layer 14 is preferably about $5.3 \times 10^{16}$ ohms.

Parylene polymer layers in accordance with the present invention preferably have a density of about 1.58.

The thermal expansion at 25° C. of parylene polymer layer 14 is preferably at most about 35 parts per million.

According to the present invention, parylene polymer layers have a coefficient of friction of about 0.2.

The following is an illustrative example of one embodiment of the present invention. It is not to be construed as limiting.

EXAMPLE

The following process was performed in a jacketed Soxhlet extractor (available as catalog number LG-6950, from Lab Glass, located in Vineland, N.J. or as catalog number CG-1328, available from Chem Glass, located in Vineland, N.J.). An amount of the crude dimer used as the starting material in the synthesis of the parylene polymer layers of the present invention was placed within a glass extraction thimble with a fritted glass disk at its bottom. A short chromatographic bed of particulate alumina was placed at the bottom of the thimble. The thimble was purchased with a diameter of 41 mm and a height of 130 mm. The height of the thimble was increased to 180 mm to accommodate larger samples (i.e., up to about 70 grams) of the crude dimer.

A flask of boiling n-hexane was placed below the thimble, and gaseous n-hexane was condensed in a condenser mounted above the thimble. The condensed n-hexane dripped onto the crude dimer to form a leachant solution of the condensed n-hexane, purified dimer and impurities, including dirt, dust, and/or polymers or oligomers of the monomer formed by the dimer. The leachant solution passed through the chromatographic bed and fritted glass at the bottom of the thimble. The chromatographic bed removed many polar or ionic impurities present within the leachant solution due to the polar nature of alumina. In addition, the chromatographic bed removed fine impurities by filtration.

A siphoning mechanism was used to periodically empty the leachant solution from the Soxhlet extractor holding the thimble. This process returned the n-hexane from the leachant solution to the flask of boiling n-hexane. After a period of from about 10 to about 20 hours, the crude dimer ended up in the flask of boiling n-hexane.

The extraction was conducted at the boiling n-hexane to speed up the dimer dissolution process. To accomplish this, a conduit jacket surrounded the extraction volume, so the extraction volume was heated by vapors of n-hexane as these vapors traveled from the boiling flask to the condenser. While this hot filtration process is advantageous because impurities are removed while the solution is hot, it is to be noted that, in conventional crystallization equipment, such a hot filtration can be difficult and/or dangerous when flammable solvents are used. Furthermore, for practical reasons, such a filtration may be performed at temperatures below the solvent boiling temperature, resulting in increased solvent use and decreased dimer solubility. However, using a Soxhlet apparatus, the boiling solvent vapors are held within the apparatus by the jacket, allowing for increased efficiency in the purification process.

The resulting purified dimer of the present invention was tested by inductively coupled plasma-mass spectrometry of the vaporized dimer. During this process, the sample is ashed to remove carbon containing components, leaving nonvolatile oxides of the trace elements to be determined. This ash is taken up in an aqueous buffer solution. The aqueous buffer solution of the sample ash is fed to an energized plasma. The high temperature of the plasma atomizes the trace elements. The atomized plasma is fed to the source of a mass spectrometer for quantification of each specific impurity elements.

The results are shown in Table 1, which clearly demonstrates that the zinc impurity levels are about 66 parts per billion. This method does not involve a direct measurement of the impurity level of the parylene polymer layer formed from the monomers. However, by measuring the impurity level of the starting material (i.e., dimer) for parylene polymer film synthesis, this method does provide an upper limit on the possible impurity level of the parylene polymer films of the present invention.

TABLE 1

| Element | Impurity Level (Parts per Billion) |
|---|---|
| Al | 460 |
| Ba | 6.2 |
| Be | <10 |
| Bi | <10 |
| Cd | <12 |
| Ca | 660 |
| Cs | 880 |
| Cr | 10 |
| Co | <1 |
| Cu | <5 |
| Ga | <1 |
| In | <1 |
| Fe | 140 |
| Pb | 7.4 |
| Li | 37 |
| Mg | 83 |
| Mn | 2.3 |
| Mo | <5 |
| Ni | 7.8 |
| K | 99 |
| Rb | <1 |
| Ag | <10 |
| Na | 500 |
| Sr | <1 |
| Th | <10 |
| Sn | 310 |
| V | <1 |
| Zn | 66 |
| Zr | <10 |

To purify about 70 grams of crude dimer according to this process, about 3 liters of n-hexane may be used. In this embodiment of the process, a 1 liter flask having an initial volume of about 0.7 l of n-hexane is utilized.

Having thus described particular embodiments of the present invention, various alterations, modifications and improvements will readily occur to those skilled in the art. Such alterations, modifications and improvements are intended to be part of this disclosure, and are intended to be within the spirit and scope of the present invention. Accordingly, the foregoing description is by way of example only and is not intended as limited. The present invention is limited only as defined by the following claims and the equivalents thereto.

We claim:

1. A multi-level structure, comprising:
   a first layer having a surface; and
   a parylene polymer layer disposed along the surface of the first layer, the parylene polymer layer being formed from a material having a structure:

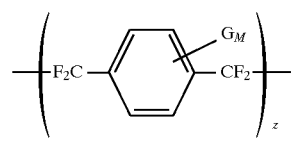

wherein m is an integer having a value of 0, 1, 2, 3 or 4, z is greater than 1, G is a halogen, an alkyl group, a cyclo hydrocarbon, an alkylene group or an alkylyne group having the general formula $C_nH_yX_w$, wherein X is a halogen, n is an integer greater than zero and a sum of y and w is at most equal to a sum of 2n and 1, and wherein the parylene polymer layer has a zinc impurity level of at most 66 parts per billion.

2. The multi-level structure according to claim 1, further comprising a second layer having a surface, wherein the parylene polymer layer is disposed along the surface of the second layer such that the parylene polymer layer is disposed between the first and second layers.

3. The multi-level structure according to claim 2, wherein the first layer is an electrically conductive material.

4. The multi-level structure according to claim 3, wherein the second layer is formed from an electrically conductive material.

5. The multi-level structure according to claim 1, wherein the parylene polymer layer has a dielectric constant of at most 2.6.

6. The multi-level structure according to claim 1, wherein the parylene polymer layer has a zinc impurity level of 66 parts per billion.

7. A method making a multi-level structure, comprising the steps of:

depositing a monomer on a surface of a first layer; and polymerizing the monomer to form a parylene polymer film on the surface of the first layer, the parylene polymer having a structure:

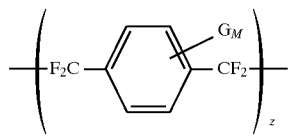

wherein m is an integer having a value of 0, 1, 2, 3 or 4, z is greater than 1, G is a halogen, an alkyl group, a cyclo hydrocarbon, an alkylene group or an alkylyne group having the general formula $C_nH_yX_w$, wherein X is a halogen, n is an integer greater than zero and a sum of y and w is at most equal to a sum of 2n and 1, and wherein the parylene polymer layer has a zinc impurity level of at most 66 parts per billion.

8. The method according to claim 7, further comprising the steps of:

vaporizing a parylene dimer; and pyrolizing the parylene dimer to form the monomer.

9. The method according to claim 8, wherein the depositing step occurs in a deposition zone of a vacuum chamber.

10. The method according to claim 9, wherein the pyrolizing step occurs outside the deposition zone of the vacuum chamber.

11. The method according to claim 10, further comprising the step of feeding the monomer into the deposition zone of the vacuum chamber.

12. The method according to claim 10, wherein the polymerizing step includes polymerizing the monomer to form a parylene polymer film having a zinc impurity level of 66 parts per billion.

13. A multi-level structure, comprising:

a first layer having a surface; and a parylene polymer layer disposed along the surface of the first layer, the parylene polymer layer being formed from a material having a structure:

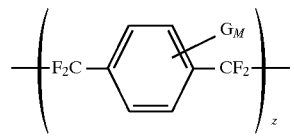

wherein m is an integer having a value of 0, 1, 2, 3 or 4, z is greater than 1, G is a halogen, an alkyl croup, a cyclo hydrocarbon, an alkylene group or an alkylyne group having the general formula $C_nH_yX_w$, wherein X is a halogen, n is an integer greater than zero, and a sum of y and w is at most equal to a sum of 2n and 1, and wherein the parylene polymer layer has a zinc impurity level of at most 66 parts per billion and wherein the parylene polymer layer is formed by a process including the steps of:

vaporizing a parylene dimer; and pyrolizing the parylene dimer to form a monomer.

14. The multi-level structure according to claim 13, wherein the process further comprises the step of depositing the monomer on a surface of a first layer.

15. The multi-level structure according to claim 14, wherein the depositing step occurs within a deposition zone of a vacuum chamber.

16. The multi-level structure according to claim 15, wherein the pyrolizing step occurs outside the deposition zone of the vacuum chamber.

17. The multi-level structure according to claim 16, wherein the process further includes the step of polymerizing the monomer on the surface of the first layer to form the parylene polymer layer.

18. The multi-level structure according to claim 17, wherein the process includes the step of feeding the monomer into a deposition zone of a vacuum chamber.

19. The multi-level structure according to claim 18, wherein the multi-level structure has a zinc impurity level of 66 parts per billion.

20. The multi-level structure according to claim 13, wherein the parylene polymer layer has a zinc impurity level of 66 parts per billion.

21. The multi-level structure according to claim 20, wherein the parylene polymer layer has a dielectric constant of at most 2.6.

22. The multi-level structure according to claim 13, wherein the parylene polymer layer has a dielectric constant of at most 2.6.

23. The method according to claim 7, further comprising the steps of:

vaporizing parylene dimer; and cleaving the parylene dimer by use of a plasma.

24. The method according to claim 23, wherein the depositing step occurs in a deposition zone of a vacuum chamber.

25. The method according to claim 24, wherein the pyrolizing step occurs outside the deposition zone of the vacuum chamber.

26. The method according to claim 25, further comprising the step of feeding the monomer into the deposition zone of the vacuum chamber.

27. The method according to claim 26, wherein the polymerizing step includes polymerizing the monomer to form a parylene polymer film having a zinc impurity level of 66 parts per billion.

28. A multi-level structure, comprising:

a first layer having a surface; and a parylene polymer layer disposed along the surface of the first layer, the parylene polymer layer being formed from a material having a structure:

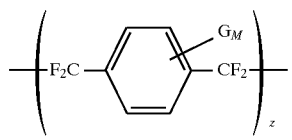

wherein m is an integer having a value 0, 1, 2, 3 or 4, z is greater than 1, G is a halogen, an alkyl group, a cyclo hydrocarbon, an alkylene group or an alkylyne group having the general formula $C_nH_yX_w$, wherein X is a halogen, n is an integer greater than zero, and a sum of y and w is at most equal to a sum of 2n and 1, and wherein the parylene polymer layer has a zinc impurity level of at most 66 parts per billion and wherein the parylene polymer layer is formed by a process including the steps of:

vaporizing a parylene dimer; and exposing the parylene dimer to a plasma.

29. The method according to claim 28 wherein the step of exposing the parylene dimer to a plasma forms a monomer.

30. The multi-level structure according to claim 28, wherein the process further comprises the step of depositing the monomer on a surface of a first layer.

31. The multi-level structure according to claim 30, wherein the depositing step occurs within a deposition zone of a vacuum chamber.

32. The multi-level structure according to claim 31, wherein the process further includes the step of polymerizing the monomer on the surface of the first layer to form the parylene polymer layer.

33. The multi-level structure according to claim 32, wherein the process includes the step of feeding the monomer into a deposition zone of a vacuum chamber.

34. The multi-level structure according to claim 33, wherein the multi-level structure has a zinc impurity level of 66 parts per billion.

35. The multi-level structure according to claim 28, wherein the parylene polymer layer has a zinc impurity level of 66 parts per billion.

36. The multi-level structure according to claim 35, wherein the parylene polymer layer has a dielectric constant of at most 2.6.

37. The multi-level structure according to claim 34, wherein the parylene polymer layer has a dielectric constant of at most 2.6.

38. The multi-level structure according to claim 28, wherein the parylene polymer layer has a dielectric constant of at most 2.6.

39. The multi-level structure according to claim 29, wherein the process further comprises the step of depositing the monomer on a surface of a first layer.

40. The multi-level structure according to claim 39, wherein the depositing step occurs within a deposition zone of a vacuum chamber.

41. The multi-level structure according to claim 40, wherein the pyrolizing step occurs outside the deposition zone of the vacuum chamber.

42. The multi-level structure according to claim 41, wherein the process further includes the step of polymerizing the monomer on the surface of the first layer to form the parylene polymer layer.

43. The multi-level structure according to claim 42, wherein the process included the step of feeding the monomer into a deposition zone of a vacuum chamber.

44. The multi-level structure according to claim 43, wherein the multi-level structure has a zinc impurity level of 66 parts per billion.

45. The multi-level structure according to claim 44, wherein the parylene polymer layer has a dielectric constant of at most 2.6.

46. The method according to claim 7, further comprising the step of:

treating the parylene polymer film to increase adhesion of the parylene polymer film.

47. The method according to claim 46, wherein the treating step includes plasma treating.

48. The method according to claim 46, wherein the treating includes corona treating.

49. The method according to claim 13, further comprising the step of:

treating the parylene polymer film to increase adhesion of the parylene polymer film.

50. The method according to claim 49, wherein the treating step includes plasma treating.

51. The method according to claim 49, wherein the treating includes corona treating.

52. The method according to claim 25, further comprising the step of:

treating the parylene polymer film to increase adhesion of the parylene polymer film.

53. The method according to claim 52, wherein the treating step includes plasma treating.

54. The method according to claim 53, wherein the treating includes corona treating.

* * * * *